United States Patent
Fujikawa

(10) Patent No.: US 11,326,274 B2
(45) Date of Patent: May 10, 2022

(54) SINGLE CRYSTAL GROWTH CRUCIBLE HAVING A FIRST HOUSING AND A SECOND HOUSING, AND SINGLE CRYSTAL PRODUCTION DEVICE

(71) Applicant: SHOWA DENKO K.K., Tokyo (JP)

(72) Inventor: Yohei Fujikawa, Hikone (JP)

(73) Assignee: SHOWA DENKO K.K., Tokyo (JP)

( * ) Notice: Subject to any disclaimer, the term of this patent is extended or adjusted under 35 U.S.C. 154(b) by 0 days.

(21) Appl. No.: 16/910,542

(22) Filed: Jun. 24, 2020

(65) Prior Publication Data
US 2020/0407872 A1     Dec. 31, 2020

(30) Foreign Application Priority Data

Jun. 26, 2019  (JP) .............................. JP2019-118988
Apr. 17, 2020  (JP) .............................. JP2020-074030

(51) Int. Cl.
*C30B 35/00* (2006.01)
*C30B 23/02* (2006.01)
*C23C 14/24* (2006.01)

(52) U.S. Cl.
CPC ............ *C30B 23/02* (2013.01); *C23C 14/243* (2013.01); *C30B 35/002* (2013.01)

(58) Field of Classification Search
CPC ......... C30B 23/00; C30B 23/02; C30B 23/06; C30B 29/00; C30B 29/10; C30B 29/36; C30B 35/00; C30B 35/002; C23C 14/06; C23C 14/0635; C23C 14/243; F27B 14/08; F27B 14/0843; F27B 14/0875; F27B 14/0881; F27B 14/10; F27B 14/102; F27B 14/104

USPC .......... 117/84, 88, 102, 200, 204, 937, 951; 118/715, 726
See application file for complete search history.

(56) References Cited

U.S. PATENT DOCUMENTS

2012/0132139 A1*  5/2012  Kondo .................... C30B 23/00
                                                            118/725

FOREIGN PATENT DOCUMENTS

JP          4367173 B2 *  11/2009
JP          4367173 B2     11/2009

* cited by examiner

*Primary Examiner* — Kenneth A Bratland, Jr.
(74) *Attorney, Agent, or Firm* — Sughrue Mion, PLLC

(57) ABSTRACT

Provided is a single crystal growth crucible including a first housing and a second housing, in which a fitting portion between the first housing and the second housing has a first protruding portion, which is provided by protruding inner wall side of the first housing toward the second housing, and a second protruding portion, which is provided by protruding outer wall side of the second housing toward the first housing and covers an outer circumferential surface of the first protruding portion, the first protruding portion is formed such that an outer diameter of a tip portion thereof is larger than that of a base portion thereof in the protruding direction, and the second protruding portion is formed such that an inner diameter of a tip portion thereof is smaller than that of a base portion thereof in the protruding direction, the outer diameter of the tip portion of the first protruding portion is equal to or smaller than the inner diameter of the tip portion of the second protruding portion at room temperature, and the outer diameter of the tip portion of the first protruding portion is larger than the inner diameter of the tip portion of the second protruding portion at a single crystal growth temperature.

6 Claims, 4 Drawing Sheets

SINGLE CRYSTAL GROWTH CRUCIBLE HAVING A FIRST HOUSING AND A SECOND HOUSING, AND SINGLE CRYSTAL PRODUCTION DEVICE

BACKGROUND OF THE INVENTION

Field of the Invention

The present invention relates to a single crystal growth crucible used for growing a single crystal of SiC or the like, and a single crystal production device including the same. Priority is claimed on Japanese Patent Application No. 2019-118988, filed Jun. 26, 2019 and Japanese Patent Application No. 2020-074030, filed Apr. 17, 2020, the contents of which are incorporated herein by reference.

Description of Related Art

Silicon carbide (SiC) has a dielectric breakdown electric field that is one order of magnitude larger and a band gap that is three times larger than those of silicon (Si). Also, silicon carbide (SiC) has characteristics such as a thermal conductivity about three times higher than that of silicon (Si). It is expected that silicon carbide (SiC) will be able to be applied to power devices, high frequency devices, high temperature operating devices and the like.

A SiC epitaxial wafer in which an epitaxial film has been formed on a SiC wafer is used for devices such as semiconductors. An epitaxial film provided on a SiC wafer using chemical vapor deposition (CVD) becomes an active region of a SiC semiconductor device. A SiC wafer is obtained by processing a SiC ingot.

A SiC ingot can be produced using a method such as a sublimation recrystallization method (hereinafter referred to as a sublimation method). The sublimation method is a method of obtaining a single crystal, for example, by putting a SiC source and a seed crystal in a crucible (a single crystal growth crucible) formed of graphite or the like and recrystallizing a source gas, which is sublimated from the source by heating the crucible, on the seed crystal.

A single crystal growth crucible used for such a sublimation method is generally configured of a main body portion and a lid portion which have a cylindrical space (a crystal growth space) therein and which can engage with and disengage from each other. In addition, a fitting portion between the main body portion and the lid portion desirably has a structure in which leakage of a source gas is prevented as much as possible during single crystal growth.

For example, Patent Document 1 discloses a single crystal production device in which a thermal expansion coefficient of a second member constituting a crucible is larger than that of a first member, whereby a gap between fitting portions of the first member and the second member is decreased at the time of heating the crucible so that leakage of a sublimation gas (a source gas) can be reduced.

PATENT DOCUMENTS

[Patent Document 1] Japanese Patent No. 4367173

SUMMARY OF THE INVENTION

Problems to be Solved by the Invention

However, in the single crystal production device disclosed in Patent Document 1, the surface at which the first member and the second member come into contact, with each other in the fitting portions forms a surface which is parallel to a vertical direction of the crucible. In such a configuration, the sublimation gas (source gas) generated from the source due to heating raises a crucible internal pressure, and as a result, there is a concern that a gap may be generated between the first member and the second member and the sublimation gas may leak out.

In addition, the members constituting the crucible can be screwed together by a screw structure or the like so that the sublimation gas does not leak from the gap between the members due to such an increase in the crucible internal pressure. However, such a configuration cannot absorb thermal expansion of the members generated by heating the crucible, and as a result, there is a concern that cracks may occur in the screwed portion.

The present invention has been made in view of the above circumstances, and an object of the present invention is to provide a single crystal growth crucible and a single crystal production device including the same in which there is no concern of a source gas leaking from a fitting portion at which members constituting the crucible fit together even when an internal pressure of the crucible rises due to generation of the source gas, and cracks do not occur at the fitting portion even when the members are thermally expanded by heating.

Means for Solving the Problems in order to solve the problems described above, a single crystal growth crucible according to the first aspect of the present invention is a single crystal growth crucible comprising a first housing and a second housing, wherein a cylindrical space is formed by the first housing and the second housing inside the crucible, the first housing and the second housing fit together at a fitting portion of the crucible, and the first housing and the second housing are separable from each other, the first housing includes a first protruding portion which protrudes toward the second housing and is located at an inner wall side thereof, the second housing includes a second protruding portion which protrudes toward the first housing and is located at an outer wall side thereof and covers an outer circumferential surface of the first protruding portion, the first housing is configured of a material having a larger linear expansion coefficient than that of the second housing, the fitting portion is configured of the first protruding portion and the second protruding portion, the first protruding portion has an outer circumferential surface and an outer diameter of a tip portion of the outer circumferential surface is larger than that of a base portion thereof in the protruding direction, the second protruding portion has an inner circumferential surface and an inner diameter of a tip portion of the inner circumferential surface is smaller than that of a base portion thereof in the protruding direction, at room temperature, the outer diameter of the tip portion of the first protruding portion is equal to or smaller than the inner diameter of the tip portion of the second protruding portion, and at a single crystal growth temperature, the outer diameter of the tip portion of the first protruding portion is larger than the inner diameter of the tip portion of the second protruding portion.

The first aspect of the present invention may have a configuration in which the outer diameter of the outer circumferential surface of the first protruding portion increases constantly from the base portion toward the tip portion, and the inner diameter of the inner circumferential surface of the second protruding portion decreases constantly from the base portion toward the tip portion.

The first aspect of the present invention may have a configuration in which the outer circumferential surface of the first protruding portion has two circumferential surfaces, which have different outer diameters, at the base portion and the tip portion, and the inner circumferential surface of the second protruding portion has two circumferential surfaces, which have different inner diameters, at the base portion and the tip portion.

In the first aspect of the present invention, at room temperature, a difference between the outer diameter of the tip portion of the first protruding portion and the inner diameter of the tip portion of the second protruding portion may be in a range of 0 mm or more and 1 mm or less. In addition, in order to facilitate the fitting of the members, the difference may be more than 0 mm, and may be, for example, 0.1 mm or more and 1 mm or less.

Also, in the first aspect of the present invention, a difference between the linear expansion coefficient of the first housing and the linear expansion coefficient of the second housing may be in a range of $0.4\times10^{-6}$ ($1/^\circ$ C.) or more and $4\times10^{-6}$ ($1/^\circ$ C.) or less.

Also, a single crystal production device according to a second aspect of the present invention is characterized by including at least the single crystal growth crucible described in each of the above claims and a heating unit configured to heat the single crystal growth crucible.

Effects of the Invention

According to the present invention, it is possible to provide a single crystal growth crucible and a single crystal production device including the same in which there is no concern of a source gas leaking from a fitting portion in which members constituting the crucible fit together even when an internal pressure of the crucible rises due to generation of the source gas, and cracks do not occur at the fitting portion even when the members are thermally expanded by heating.

DETAILED DESCRIPTION OF THE INVENTION

Hereinafter, preferred examples of a single crystal growth crucible and a single crystal production device including the same according to one embodiment of the present invention will be described with reference to the drawings. Also, the following embodiment is specifically described in order to better understand the gist of the present invention and does not limit the present invention unless otherwise specified. Further, in figures used for the following description, a main part may be shown in an enlarged manner for convenience in order to make features of the present invention easy to understand, and dimensions, ratios and the like of each component are not necessarily the same as that of actual ones. For example, various modifications, omissions, combinations, substitutions, and/or additions with respect to positions, materials, configurations, shapes, sizes, magnitudes, numerical values, ratios, numbers, and the like can be made. Also, a first embodiment and a second embodiment may share descriptions and preferable examples with each other unless there is a contradiction.

(Single Crystal Production Device)

Figure 1:
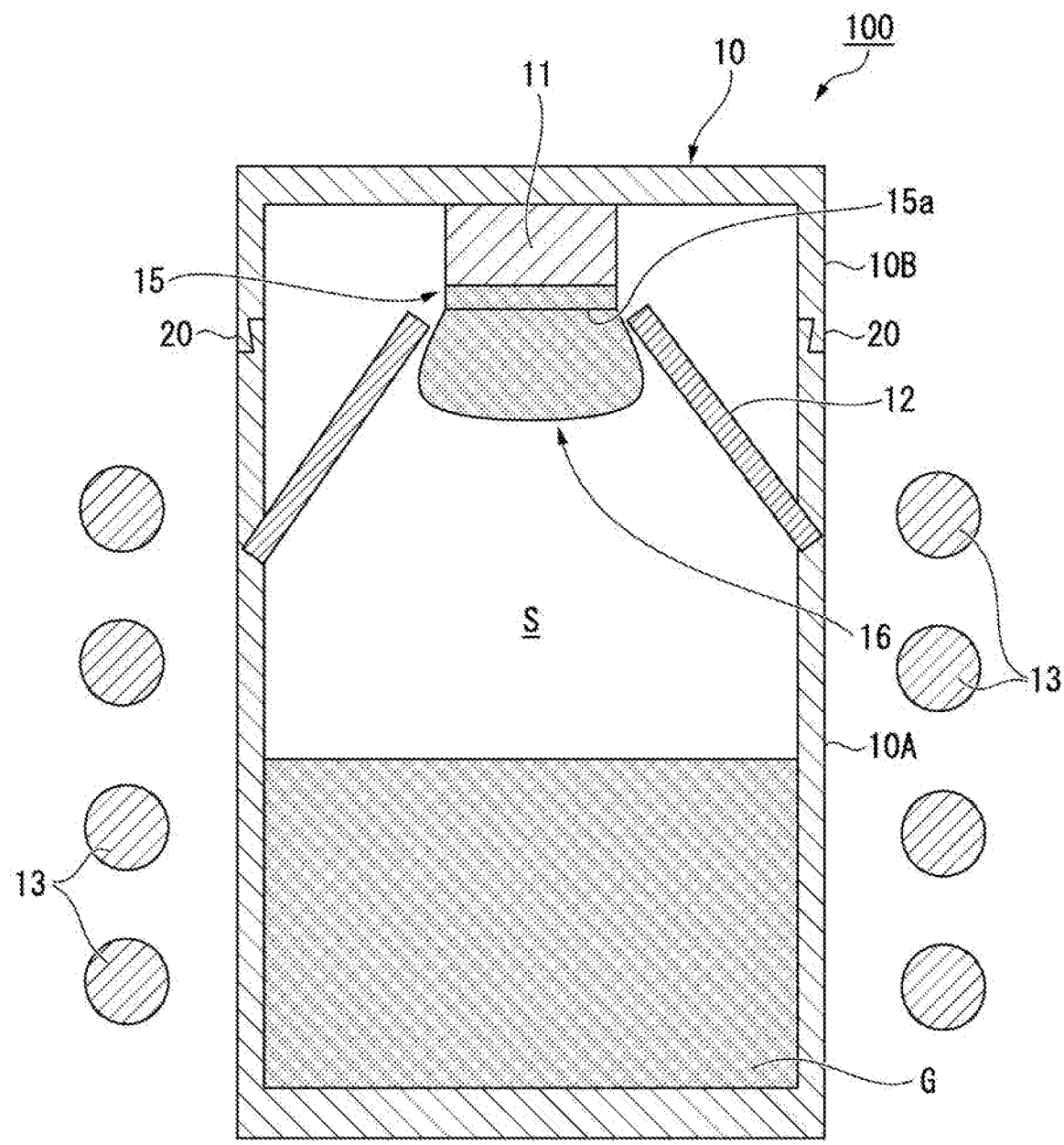
FIG. 1 is a schematic diagram for showing an example of a single crystal production device according to the present invention.

FIG. 1 is a cross-sectional view showing a preferred example of a single crystal production device used for producing a SiC ingot.

A single crystal production device 100 suitable for producing a SiC ingot is a SiC single crystal production device using a sublimation method. A source gas (a sublimation gas) generated by heating a source can be recrystallized on a single crystal (a seed crystal) to obtain a large single crystal (an ingot).

The single crystal production device 100 has a crucible (a single crystal growth crucible) 10 and a coil 13. A heating element (not shown) that generates heat on the basis of induction heating of the coil 13 may be provided between the crucible 10 and the coil 13.

The crucible 10 has a cylindrical space (a crystal growth space) S formed therein. In the present embodiment, the crucible has a cylindrical external shape, but is not limited thereto. The crucible 10 has a first housing 10A and a second housing 10B fit together at a fitting portion 20 and is formed to be able to be separated into the first housing 10A and the second housing 10B at the fitting portion 20. In the present embodiment, the first housing 10A is a lower housing in a vertical direction, and the second housing 10B is an upper housing in the vertical direction. These housings are ones each of which has one open surface and fit together such that their openings face each other at the time of fitting.

The first housing 10A and the second housing 10B constituting the crucible 10 are made of materials selected arbitrarily, and they are configured of graphite in the present embodiment. Also, the first housing 10A is configured of a material having a larger linear expansion coefficient than that of the second housing 10B. In the present embodiment, by using graphite having different densities, the linear expansion coefficient of the first housing 10A is made to be larger than the linear expansion coefficient of the second housing 10B. Specifically, the first housing 10A is made of high-density graphite and the second housing 10B is made of low-density graphite.

For example, the first housing 10A is preferably made of a material having a linear expansion coefficient of about $4\times10^{-6}$ ($1/^\circ$ C.) or more and about $7\times10^{-6}$ ($1/^\circ$ C.) or less, and the second housing 10B is preferably made of a material having a linear expansion coefficient of about $3\times10^{-6}$ ($1/^\circ$ C.) or more and about $6\times10^{-6}$ ($1/^\circ$ C.) or less. In addition, a difference between the linear expansion coefficient of the first housing 10A and the linear expansion coefficient of the second housing 10B is preferably within a range of $0.4\times10^{-6}$ ($1/^\circ$ C.) or mom and $4\times10^{-6}$ ($1/^\circ$ C.) or less. Further, the linear expansion coefficient can be obtained, for example, using an optical scanning type measuring apparatus or a thermomechanical analyzer. The linear expansion coefficient may be a secant coefficient of thermal expansion. The linear expansion coefficient may be, for example, a value obtained according to the method described in JIS Z 2285.

The second housing 10B of the crucible 10 has a crystal placement portion 11 provided at a position facing a source G. The crucible 10 may have a tapered guide 12 therein whose diameter increases from the crystal placement portion 11 toward the source G.

Also, although the source G, a seed crystal 15, and a SiC ingot 16 grown from the seed crystal 15 are shown at the same time for easy understanding in FIG. 1, such a state does not necessarily need to be generated at the time of actual production.

When an alternating current is applied to the coil 13, the crucible 10 is heated and the source gas is generated in a space S from the source G. The generated source gas is supplied to the seed crystal 15 placed in the crystal placement portion 11 along the tapered guide 12. By supplying the source gas to the seed crystal 15, the SiC ingot (a SiC single crystal) 16 is formed due to the crystal growth on a main surface (a crystal growth surface) 15a of the seed crystal 15. For example, the main surface 15a of the seed crystal 15 is preferably a carbon surface or a surface provided with an off angle of 10 degrees or less from the carbon surface.

Figure 2:
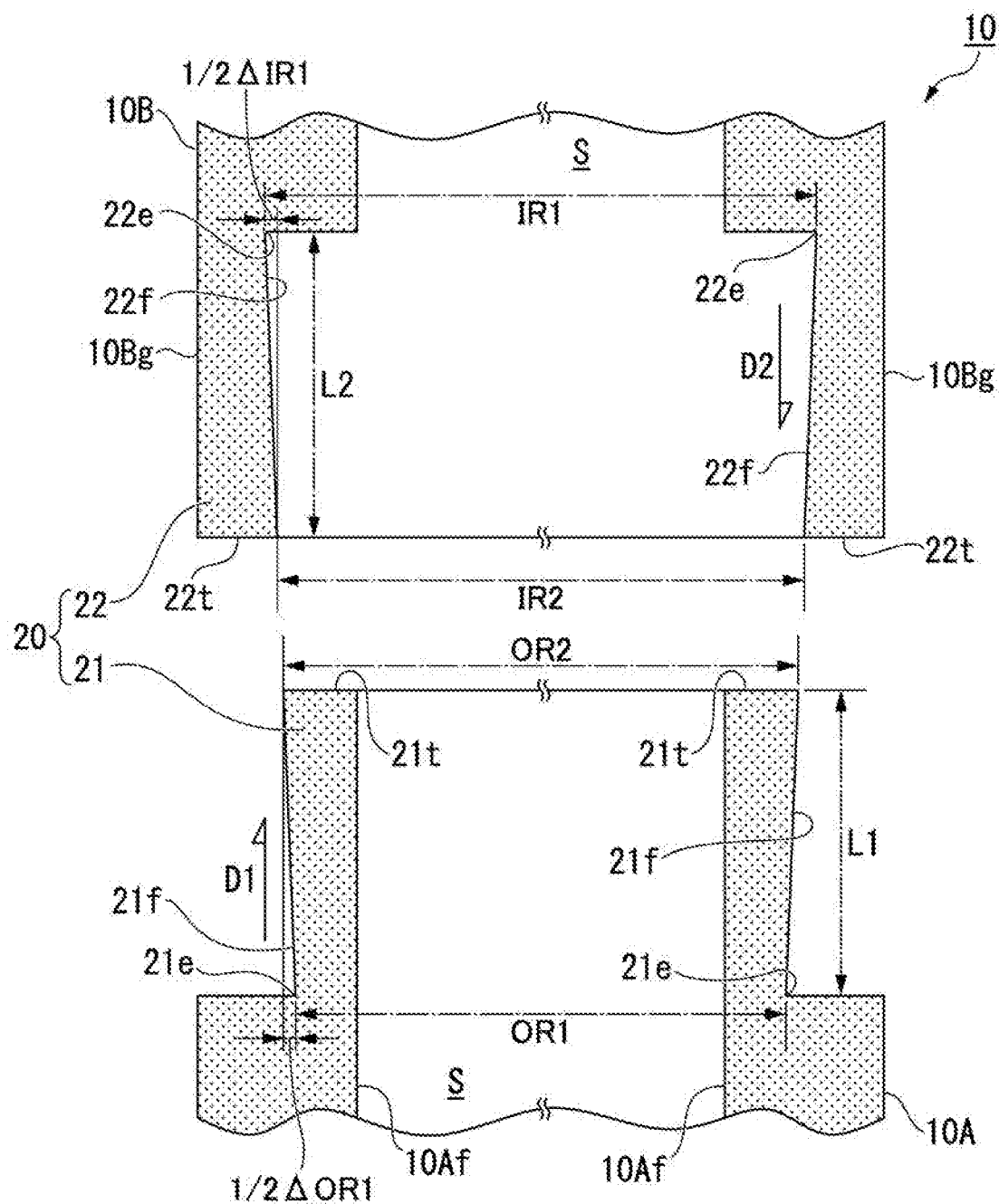
FIG. 2 is an enlarged cross-sectional view of an essential part for showing an example of the vicinity of a fitting portion of a single crystal growth crucible according to one embodiment of the present invention.

FIG. 2 is an enlarged cross-sectional view of an essential part for showing an example of the vicinity of the fitting portion of the single crystal growth crucible according to the first embodiment of the present invention. FIG. 2 shows a vertical cross-section of the crucible. Also, FIG. 2 is a state at room temperature (25° C.) and shows a state in which the first housing and the second housing are separated from each other. The first housing and the second housing are integrated with each other by being fitted together at the fitting portion. The cylindrical space is formed inside the crucible formed by the integrated housings. The external shape of the crucible can be arbitrarily selected, but may be cylindrical.

A first protruding portion 21 that constitutes the fitting portion 20 is formed integrally with the first housing 10A at an upper open end of the first housing 10A, that is, at an upper end portion of the first housing 10A. That is, the housing and the protruding portion are made of the same material. The first protruding portion 21 is a portion of the first housing 10A which is located on an inner wall 10Af side and protrudes toward the second housing 10B. The first protruding portion may be a cylindrical or substantially cylindrical portion. A cross-section of the first protruding portion 21 in a horizontal direction of the crucible, that is, a cross-section perpendicular to the vertical direction of the crucible, and a surface of a tip portion 2t thereof may have a donut shape. The first protruding portion 21 has an outer circumferential surface and is formed such that an outer diameter OR2 of the tip portion (a tip surface) 21t is larger than an outer diameter OR1 of a base portion 21e thereof in a protruding direction D1 thereof. Also, the base portion 21e may indicate a base end portion of the first protruding portion at which the outer diameter OR2 is the smallest. In the present embodiment, a tapered outer circumferential surface 21f whose outer diameter increases constantly (uniformly) front the base portion 21e to the tip portion 21t is formed in the first protruding portion 21. Thus, the outer circumferential surface of the first protruding portion may be an inclined surface. Also, an inner circumferential surface thereof may be a vertical surface. Further, the first protruding portion 21 may have a flat end surface at the tip. The flat end surface preferably comes into contact with a flat surface portion of the second housing that is connected to a base portion of a second protruding portion 22.

The second protruding portion 22 constituting the fitting portion 20 is formed integrally with the second housing 10B at a lower open end of the second housing 10B, that is, at a lower end portion of the second housing 10B. The second protruding portion 22 is a portion of the second housing 10B which is located on an outer wall 10Bg side, protrudes toward the first housing 10A, and covers the outer circumferential surface 21f of the first protruding portion 21. The second protruding portion may have a cylindrical shape or a substantially cylindrical shape. A cross-section of the second protruding portion 22 in the horizontal direction of the crucible and a surface of a tip portion 22t thereof may have a donut shape. The second protruding portion 22 has an inner circumferential surface and is formed such that an inner diameter IR2 of the tip portion 22t is smaller than an inner diameter IR1 of the base portion 22e in a protruding direction D2 thereof. In the present embodiment, a tapered inner circumferential surface 22f whose inner diameter decreases constantly from the based portion 22e to the tip portion 22t in the second protruding portion 22. Thus, the second protruding portion may have an inclined inner circumferential surface. The outer circumferential surface may be a vertical surface. The second protruding portion 22 may have a flat end surface at the tip. The flat end surface preferably comes into contact with a flat surface portion of the first housing that is connected to the base portion of the first protruding portion 21. Further, the tip portion 21t of the first protruding portion and the tip portion 22t of the second protruding portion are located at positions separated from each other. In addition, in the fitting portion 20, the outer circumferential surface 21f of the first protruding portion 21 and the inner circumferential surface 22f of the second protruding portion 22 are surfaces facing each other.

A relationship between the first protruding portion 21 and the second protruding portion 22 in the fitting portion 20 has the following relationship. At room temperature (25° C.), the protruding portions are formed such that the outer diameter OR2 of the tip portion 21t of the first protruding portion 21 is equal to or smaller than the inner diameter IR2 of the tip portion 22t of the second protruding portion 22. For example, in a plan view at room temperature, an outer edge of the tip portion of the first protruding portion 21 is preferably located inward from or overlaps an inner edge of the tip portion 22t of the second protruding portion 22.

Further, at a crystal growth temperature (Gt: ° C.), for example, at a temperature of 2000° C., the outer diameter OR2 of the tip portion 21t of the first protruding portion 21 is larger than the inner diameter IR2 of the tip portion 22t of the second protruding portion 22 due to a linear expansion coefficient (Te1) of the first housing 10A being larger than a linear expansion coefficient (Te2) of the second housing 10B. In this way, these protruding portions are formed.

It is preferable that the respective relationships between the outer diameter OR2 and the inner diameter IR2 at room temperature (25° C.) and at the crystal growth temperature (Gt: ° C.) described above are satisfied and then the following conditions are further satisfied. That is, the fitting portion 20 is preferably formed such that dimensional relationships between the outer diameter OR1 of the base portion 21e and the outer diameter OR2 of the tip portion 21t of the first protruding portion 21 and the inner diameter IR1 of the base portion 22e and the inner diameter IR2 of the tip portion 22t of the second protruding portion 22 satisfy the ranges (Range 1 and Range 2) indicated by the following two equations.

[Equation 1]

$$0.5 \text{ mm} \geq [IR2 + IR2 \times Te2 \times (Gt-25)] - [OR1 + OR1 \times Te1 \times (Gt-25)] \geq -0.2 \text{ mm} \quad \text{(Range 1)}$$

[Equation 2]

$$0.5 \text{ mm} \geq [IR1 + IR1 \times Te2 \times (Gt-25)] - [OR2 + OR2 \times Te1 \times (Gt-25)] \geq -0.2 \text{ mm} \quad \text{(Range 2)}$$

Values of the inner diameter and the outer diameter selected to satisfy Range 1 and Range 2 described above can be selected in consideration of physical properties such as rigidity and strength of the graphite material forming the first housing 10A and the second housing 101 of the crucible 10. In a case in which Range 1 and Range 2 have negative values, it means that the outer diameter of the first protruding portion 21 is larger than the inner diameter of the second protruding portion 22 in a high temperature environment. For that reason, it is preferable because a configuration in which the fitting portion 20 can be more firmly tightened is obtained. On the other hand, it is not suitable for a case in which a graphite material that is easily broken is used.

A size of each portion of the first protruding portion 21 at room temperature (25° C.) can be arbitrarily selected, and said portion can be formed as a preferred specific example such that the outer diameter OR1 of the base portion 21e of the first protruding portion 21 is 248 mm to 253 mm, the outer diameter OR2 of the tip portion 21t is 249 mm to 254 mm, a difference ΔOR1 between the outer diameter OR1 and the outer diameter OR2 is 0.1 mm to 1 mm, and a protruding length L1 of the first protruding portion 21 from the base portion 21e to the tip portion 21t is 5.0 mm to 5.1 mm.

A size of each portion of the second protruding portion 22 at room temperature (25° C.) can be arbitrarily selected, and said portion can be formed as a preferred specific example such that the inner diameter IR1 of the base portion 22e of the second protruding portion 22 is 250 mm to 256 mm, the inner diameter IR2 of the tip portion 22t is 249 mm to 255 mm, a difference ΔIR1 between the inner diameter R1 and the inner diameter IR2 is 0.1 mm to 1 mm, and a protruding length L2 of the second protruding portion 22 from the base portion 22e to the tip portion 22t is 5.0 mm to 5.1 mm.

Further, for example, in a fitted state, a clearance between the outer circumferential surface 2f of the first protruding portion 21 of the first housing 10A and the inner circumferential surface 22f of the second protruding portion 22 of the second housing 108 at room temperature (25° C.) can be preferably formed to be 0.1 mm to 1 mm.

According to the crucible (single crystal growth crucible) 10 and the single crystal production device 10 including the same of the present embodiment configured as described above, at room temperature (25° C.), the outer diameter OR2 of the tip portion 21t that is the largest of outer diameters of the first protruding portion 21 in the fitting portion 20 of the crucible 10 is equal to or smaller than the inner diameter IR2 of the tip portion 22t that is the smallest of inner diameters of the second protruding portion 22. Thus, the clearance is maintained between the outer circumferential surface 21f of the first protruding portion 21 and the inner circumferential surface 22f of the second protruding portion 22. For this reason, the second housing 10B having the seed crystal 15 attached thereto can be easily fitted to the first housing 10A having the source G in the space S at the fitting portion 20.

Next, when such a crucible 10 is heated to the crystal growth temperature of, for example, 2000° C., each portion of the crucible 10 made of graphite is thermally expanded. In this case, the respective housings use graphite having different densities. That is, the linear expansion coefficient of the first housing 10A is formed to be larger than the linear expansion coefficient of the second housing 10B. For this reason, a ratio of a size of the first protruding portion 21 to a size of the second protruding portion 22 at the fitting portion 20 changes due to heat.

Figure 3:
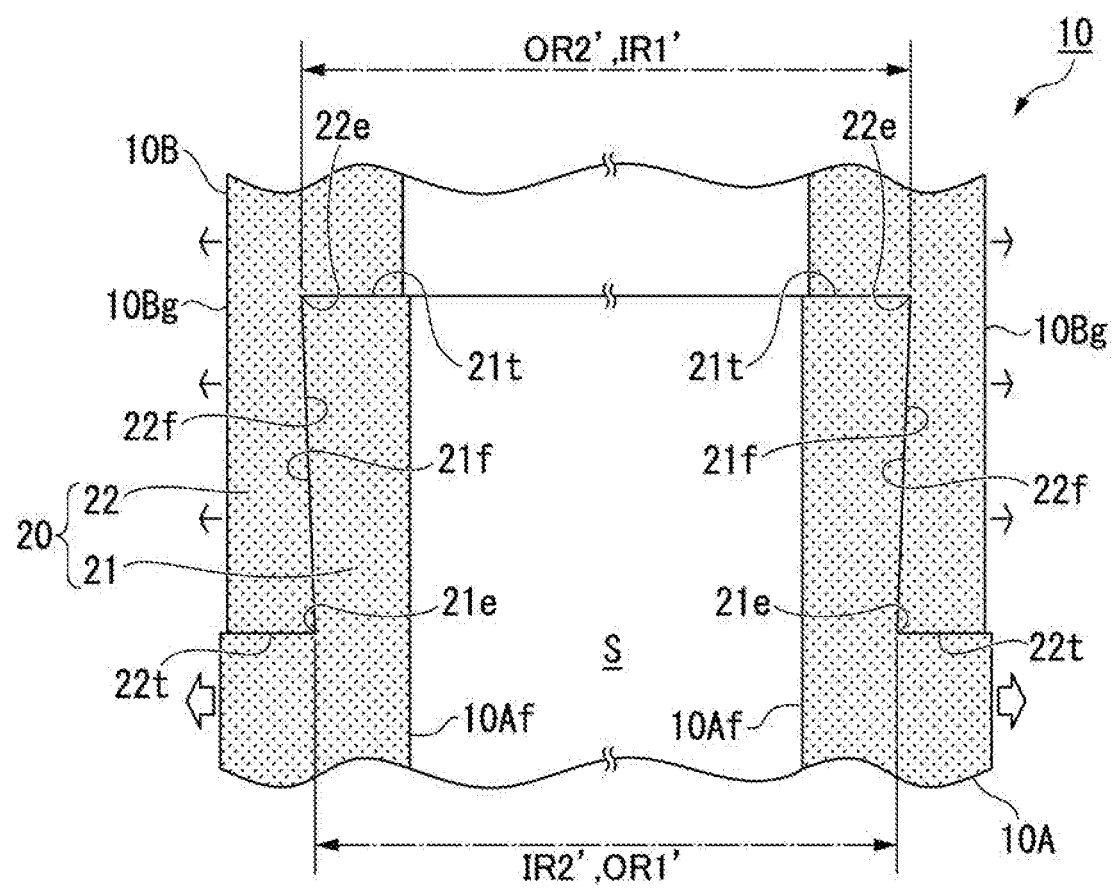
FIG. 3 is an explanatory diagram for explaining an example of an operation of the single crystal growth crucible according to the present invention.

For example, when they are heated at the crystal growth temperature of 2000° C., the first protruding portion 21 is thermally expanded more than the second protruding portion 22. As a result, as shown in FIG. 3, an outer diameter OR2' of the tip portion 21t of the first protruding portion 21 becomes larger than an inner diameter IR2' of the tip portion 22t of the second protruding portion 22 in the fitting portion 20.

Due to this change, the clearance between the outer circumferential surface 21f of the first protruding portion 21 and the inner circumferential surface 22f of the second protruding portion 22, which was present at room temperature (25° C.), disappears, that is, becomes zero. As a result, the outer circumferential surface 21f of the first protruding portion 21 and the inner circumferential surface 22f of the second protruding portion 22 conic into closer contact with each other.

As a result, at the crystal growth temperature, the source gas (sublimation gas) generated from the source G doe not leak from the fitting portion 20, and it becomes possible to reliably seal the source gas within the space S inside the crucible 10.

Also, at the crystal growth temperature, the outer diameter OR2' of the tip portion 21t of the first protruding portion 21 becomes larger than the inner diameter IR2' of the tip portion 22t of the second protruding portion 22. As a result, a strong fitted state providing an excellent sealing force is obtained, and thus, even when an internal pressure in the space S rises due to generation of the source gas, it is also possible to reliably prevent the second housing 10B from being lifted up and removed from the first housing 10A.

Further, at the crystal growth temperature, the thermally expanded first protruding portion 21 and second protruding portion 22 come into contact with each other at the tapered outer circumferential surface 21f and the tapered inner circumferential surface 22f. For this reason, in the present embodiment, the fitting portion 20 does not have an acute groove, a protrusion, or the like that easily becomes a starting point of a crack. Therefore, as compared with a screw structure or the like, it becomes possible to effectively inhibit an occurrence of cracks resulting from thermal expansion at the fitting portion 20.

Figure 4:
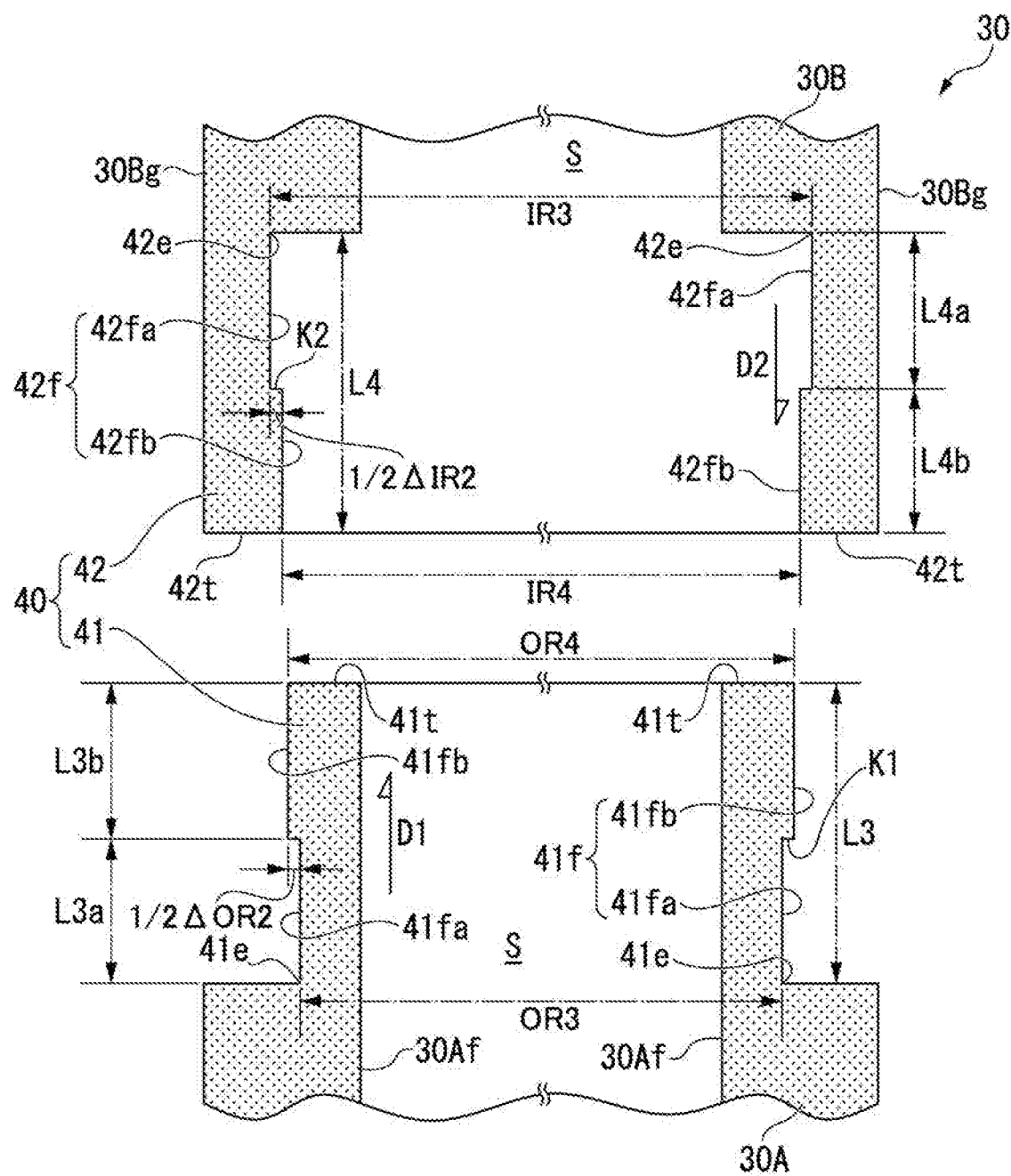
FIG. 4 is an enlarged cross-sectional view of an essential par for showing an example of the vicinity of a fitting portion of a single crystal growth crucible according to another embodiment of the present invention.

In addition, in the embodiment described above, the outer circumferential surface 21f of the first protruding portion 21 and the inner circumferential surface 22f of the second protruding portion 22 have the respective tapered surfaces in which the outer diameter or the inner diameter of the housings changes constantly (uniformly) from the base portions to the tip portions. In addition to this, for example, surfaces in which the outer diameter or the inner diameter thereof changes nonuniformity from the base portions toward the tip portions may be formed, FIG. 4 is an enlarged cross-sectional view of an essential part for showing an example of the vicinity of the fitting portion of a single crystal growth crucible according to another embodiment (a second embodiment) of the present invention. FIG. 4 shows a state at room temperature (25° C.) and shows a state in which the first housing and the second housing are separated from each other.

A first housing 30A constituting the crucible (single crystal growth crucible) 30 of the present embodiment is made of a material having a larger linear expansion coefficient than that of a second housing 30B. In the present embodiment, the linear expansion coefficient of the first housing 30A is larger than the linear expansion coefficient of the second housing 30B.

A first protruding portion 41 that constitutes a fitting portion 40 is integrally formed at an upper open end of the first housing 30A. The first protruding portion 41 is a portion of the first housing 30A which is located on an inner wall 30Af side and protrudes toward the second housing 308. In the present embodiment, an outer circumferential surface 41f of the first protruding portion 41 has two cylindrical circumferential surfaces, that is, has a circumferential surface (a first outer circumferential surface) 41fa including a base portion 41e and a circumferential surface (a second outer circumferential surface) 41fb including a tip portion 41t. A step K1 is formed at a connection portion between the two circumferential surfaces 41fa and 41fb. In addition, the first protruding portion 41 is formed such that an outer diameter OR4 of the circumferential surface 41fb of the tip portion 41t is larger than an outer diameter OR3 of the circumferential surface 41fa of the base portion 41e in the protruding direction D1 thereof.

A second protruding portion 42 constituting the fitting portion 40 is integrally formed at a lower open end of the second housing 30B. The second protruding portion 42 is a portion which covers the outer circumferential surface 41f of the first protruding portion 41 and protrudes toward the first housing 30A as a portion of the second housing 30B located on an outer wall 30Bg side. In the present embodiment, the inner circumferential surface 42f of the second protruding portion 42 has two cylindrical circumferential surfaces, that is, has a circumferential surface (a first inner circumferential surface) 42fa including a base portion 42e and a circumferential surface (a second inner circumferential surface) 42fb including a tip portion 42t. A step K2 is formed in a connection portion between the two circumferential surfaces 42fa and 42fb of the second protruding portion 42. In addition, the second protruding portion 42 is formed such that an inner diameter IR4 of the circumferential surface (second inner circumferential surface) 42fb including the tip portion 42t is smaller than an inner diameter IR3 of the circumferential surface (first inner circumferential surface) 42fa including the base portion 42e in the protruding direction D2 thereof.

Also, in the fitting portion 40, the circumferential surface (first outer circumferential surface) 41fa of the first protruding portion 41 and the circumferential surface (second inner circumferential surface) 42fb of the second protruding portion 42 are surfaces facing each other. The circumferential surface (second outer circumferential surface) 41fb of the first protruding portion 41 and the circumferential surface (first inner circumferential surface) 42fa of the second protruding portion 42 are surfaces facing each other.

A relationship between the first protruding portion 41 and the second protruding portion 42 in the fitting portion 40 is formed such that, at room temperature (25° C.), the outer diameter OR4 of the circumferential surface (second outer circumferential surface) 41fb including the tip portion 41t of the first protruding portion 41 is equal to or smaller than the inner diameter IR4 of the circumferential surface (second inner circumferential surface) 42fb including the tip portion 42t of the second protruding portion 42. For example, in a plan view at room temperature, it is preferable that an outer edge of the tip portion of the first protruding portion 41 is located inward from or overlaps an inner edge of the tip portion 42t of the second protruding portion 42.

Further, at the crystal growth temperature (Gt: ° C.) of, for example, 2000° C., a linear expansion coefficient (Te3) of the first housing 30A is larger than a linear expansion coefficient (Te4) of the second housing 308. Accordingly, the outer diameter OR4 of the circumferential surface 41fb of the first protruding portion 41 is formed to be larger than the inner diameter IR4 of the circumferential surface 42fb of the second protruding portion 42.

It is preferable that the respective relationships between the outer diameter OR4 and the inner diameter IR4 at room temperature (25° C.) and at the crystal growth temperature (Gt: ° C.) described above are satisfied and then the following conditions are further satisfied. That is, the fitting portion 40 is preferably formed such that dimensional relationships between the outer diameter OR3 of the circumferential surface (first outer circumferential surface) 41fa including the base portion 41e of the first protruding portion 41, the outer diameter OR4 of the circumferential surface (second outer circumferential surface) 41fb including the tip portion 41t, the inner diameter IR3 of the circumferential surface (first inner circumferential surface) 42fa including the base portion 42e of the second protruding portion 42, and the inner diameter IR4 of the circumferential surface (second inner circumferential surface) 42fb including the tip portion 42t satisfy ranges (Range 3 and Range 4) represented by the following two equations.

[Equation 3]

$$0.5\ \text{mm} \geq [IR4 + IR4 \times Te4 \times (Gt-25)] - [OR3 + OR3 \times Te3 \times (Gt-25)] \geq -0.2\ \text{mm} \quad \text{(Range 3)}$$

[Equation 4]

$$0.5\ \text{mm} \geq [IR3 + IR3 \times Te4 \times (Gt-25)] - [OR4 + OR4 \times Te3 \times (Gt-25)] \geq -0.2\ \text{mm} \quad \text{(Range 4)}$$

Values of the inner diameter and the outer diameter selected to satisfy Ranges 3 and 4 described above can be selected in consideration of physical properties such as rigidity and strength of the graphite material forming the first housing 30A and the second housing 30B of the crucible 30. In a case in which Range 3 and Range 4 have negative values, it means that the outer diameter of the first protruding portion 41 is larger than the inner diameter of the second protruding portion 42 in a high temperature environment. Accordingly, such a case is preferable because a configuration in which the fitting portion 40 can be more firmly tightened is obtained. On the other hand, it is not suitable for a case in which a graphite material that is easily broken is used.

A size of each portion of the first protruding portion 41 at room temperature (25° C.) can be arbitrarily selected, and said size can be formed as a preferred specific example such that the outer diameter OR3 of the circumferential surface 41fa including the base portion 41e of the first protruding portion 41 is 248 mm to 253 mm, the outer diameter OR4 of the circumferential surface 41fb including the tip portion 41t is 249 mm to 254 mm, a difference ΔOR2 between the outer diameter OR3 and the outer diameter OR4 is 0.1 mm to 1 mm, a protruding length L3 of the first protruding portion 41 from the base portion 41e to the tip portion 41t is 5.9 mm to 6.1 mm, and a ratio L3a:L3b of a length of the circumferential surface 41fa to a length of the circumferential surface 41fb in a protruding length direction thereof is about 1:1.

A size of each portion of the second protruding portion 42 at room temperature (25° C.) can be arbitrarily selected, and said size can be formed as a preferred specific example such that the inner diameter IR3 of the circumferential surface 42fa including the base portion 42e of the second protruding portion 42 is 250 mm to 256 mm, the inner diameter IR4 of the circumferential surface 42fb including the tip portion 42t is 249 mm to 255 mm, a difference ΔIR2 between the inner diameter IR3 and the inner diameter IR4 is 0.1 nm to 1 mm, a protruding length L4 of the second protruding portion 42 from the base portion 42e to the tip portion 42t is 5.9 mm to 6.1 mm, and a ratio L4a:L4b of a length of the circumferential surface 42fa to a length of the circumferential surface 42fb in the protruding length direction is 1:1 to 1:0.9.

In the crucible (single crystal growth crucible) 30 of the present embodiment configured as described above, each portion of the crucible 30 made of graphite is thermally expanded when the temperature is raised to the crystal growth temperature of, for example 2000° C. In the crucible, the linear expansion coefficient of the first housing 30A is larger than that of the second housing 30B, since graphite having different densities are used. For this reason, a ratio of a size of the first protruding portion 41 to a size of the second protruding portion 42 in the fitting portion 40 changes.

For example, at the crystal growth temperature of 2000° C. the degree of thermal expansion of the first protruding portion 41 is larger than that of the second protruding portion 42. For this reason, in the fitting portion 40, the outer diameter OR4 of the circumferential surface 41fb including the tip portion 41t of the first protruding portion 41 becomes larger than the inner diameter IR4 of the circumferential surface 42fb including the tip portion 42t of the second protruding portion 42 due to thermal expansion.

As a result, the circumferential surface 41fb of the first protruding portion 41 comes into closer contact with the circumferential surface 42fa of the second protruding portion 42. Therefore, at the crystal growth temperature, the source gas (sublimation gas) generated from the source G does not leak from the fitting portion 40, and it becomes possible to reliably seal the source gas within the space S inside the crucible 30.

Also, at the crystal growth temperature, the outer diameter OR4 of the circumferential surface (outer circumferential surface) 41t including the tip portion 41t of the first protruding portion 41 becomes larger than the inner diameter IR4 of the circumferential surface (inner circumferential surface) 42fb including the tip portion 42t of the second protruding portion 42. For this reason, even when the internal pressure in the space S rises due to the generation of the source gas, it is also possible to reliably prevent the second housing 30B from being lifted up and removed from the first housing 30A.

As described above, in the single crystal growth crucible and the single crystal production device of the present invention, there is no concern of the source gas leaking front the fitting portion even when the internal pressure of the crucible increases due to the generation of the source gas, and occurrence of cracks in the fitting portion can be prevented even when the members are thermally expanded due to heating.

Although the embodiments of the present invention have been described above, these embodiments are presented as examples and are not intended to limit the scope of the present invention. These embodiments can be implemented in various other forms, and various omissions, substitutions, and modifications can be made without departing from the spirit of the invention. The embodiments and their modifications are included in the scope and gist of the present invention and are included in the invention described in the claims and the scope of equivalents thereof.

EXPLANATION OF REFERENCES

10 Crucible (single crystal growth crucible)
10A, 30A First housing
10Af, 30Af Inner wall of first housing
10Bg, 30Bg Outer wall of second housing
10B, 30B Second housing
11 Crystal placement portion
12 Tapered guide
13 Coil
15 Seed crystal
15a Main surface of seed crystal (crystal growth surface)
16 SiC ingot
20, 40 Fitting portion
21, 41 First protruding portion of first housing
21e, 41e Base portion of first protruding portion
21f Tapered outer circumferential surface of first protruding portion
21t, 41t Tip portion of first protruding portion
22, 42 Second protruding portion of second housing
22e, 42e Base portion of second protruding portion
22f Tapered inner circumferential surface of second protruding portion
22t, 42t Tip portion of second protruding portion
41f Outer circumferential surface of first protruding portion
41fa Outer circumferential surface including base portion of first protruding portion
41fb Outer circumferential surface including tip portion of first protruding portion
42f Inner circumferential surface of second protruding portion
42fa inner circumferential surface including base portion of second protruding portion
42fb inner circumferential surface including tip portion of second protruding portion
100 Single crystal production device
D1 Protruding direction of first protruding portion of first housing
D2 Protruding direction of second protruding portion of second housing
G Source
K1, K2 Step
IR1, IR1', IR3 Inner diameter of base portion of second protruding portion
IR2, IR2', IR4 Inner diameter of tip portion of second protruding portion
L1, L3 Protruding length of first protruding portion
L2, L4 Protruding length of second protruding portion
L3a Length of base portion of first protruding portion in protruding direction
L3b Length of tip portion of first protruding portion in protruding direction
L4a Length of base portion of second protruding portion in protruding direction
L4b Length of tip portion of second protruding portion in protruding direction
OR1, OR1', OR3 Outer diameter of base portion of first protruding portion
OR2, OR2', OR4 Outer diameter of tip portion of first protruding portion
ΔOR1, ΔOR2 Difference between outer diameter of base portion and outer diameter of tip portion of first protruding portion
ΔIR1, ΔIR2 Difference between inner diameter of base portion and inner diameter of tip portion of second protruding portion
S Internal space of crucible

What is claimed is:

1. A single crystal growth crucible comprising a first housing and a second housing,
wherein a cylindrical space is formed by the first housing and the second housing inside the crucible,
the first housing and the second housing fit together at a fitting portion of the crucible, and the first housing and the second housing are separable from each other,
the first housing includes a first protruding portion which protrudes toward the second housing and is located at an inner wall side thereof,
the second housing includes a second protruding portion which protrudes toward the first housing and is located at an outer wall side thereof and covers an outer circumferential surface of the first protruding portion,
the first housing is configured of a material having a larger linear expansion coefficient than that of the second housing,
the fitting portion is configured of the first protruding portion and the second protruding portion,
the first protruding portion has an outer circumferential surface and an outer diameter of a tip portion of the outer circumferential surface is larger than that of a base portion thereof in the protruding direction,
the second protruding portion has an inner circumferential surface and an inner diameter of a tip portion of the inner circumferential surface is smaller than that of a base portion thereof in the protruding direction,
at room temperature, the outer diameter of the tip portion of the first protruding portion is equal to or smaller than the inner diameter of the tip portion of the second protruding portion, and
at a single crystal growth temperature, the outer diameter of the tip portion of the first protruding portion is larger than the inner diameter of the tip portion of the second protruding portion in a state in which the first housing and the second housing fit together.

2. The single crystal growth crucible according to claim 1, wherein the outer diameter of the outer circumferential surface of the first protruding portion increases constantly from the base portion toward the tip portion, and the inner diameter of the inner circumferential surface of the second protruding portion decreases constantly from the base portion toward the tip portion.

3. The single crystal growth crucible according to claim 1, wherein the outer circumferential surface of the first protruding portion includes two circumferential surfaces, which have different outer diameters, at the base portion and at the tip portion, and the inner circumferential surface of the second protruding portion includes two circumferential surfaces, which have different inner diameters, at the base portion and at the tip portion.

4. The single crystal growth crucible according to claim 1, wherein, at room temperature, a difference between the outer diameter of the tip portion of the first protruding portion and the inner diameter of the tip portion of the second protruding portion is in a range of 0 mm or more and 1 mm or less.

5. The single crystal growth crucible according to claim 1, wherein a difference between the linear expansion coefficient of the first housing and the linear expansion coefficient of the second housing is in a range of $0.4 \times 10^{-6}(1/^\circ C.)$ or more and $4 \times 10^{-6}(1/^\circ C.)$ or less.

6. A single crystal production device comprising at least the single crystal growth crucible according to claim 1 and a heating unit configured to heat the single crystal growth crucible.

* * * * *